(12) United States Patent
Driscoll et al.

(10) Patent No.: US 9,681,557 B2
(45) Date of Patent: Jun. 13, 2017

(54) METASTABLE GAS HEATING

(71) Applicant: Elwha LLC, Bellevue, WA (US)

(72) Inventors: Tom Driscoll, San Diego, CA (US);
William D. Duncan, Mill Creek, WA (US); Roderick A. Hyde, Redmond, WA (US); Muriel Y. Ishikawa, Livermore, CA (US); Jordin T. Kare, Seattle, WA (US); Robert C. Petroski, Seattle, WA (US); Clarence T. Tegreene, Mercer Island, WA (US); David B. Tuckerman, Lafayette, CA (US); Charles Whitmer, North Bend, WA (US); Lowell L. Wood, Jr., Bellevue, WA (US); Victoria Y. H. Wood, Livermore, CA (US)

(73) Assignee: Elwha LLC, Bellevue, WA (US)

( * ) Notice: Subject to any disclaimer, the term of this patent is extended or adjusted under 35 U.S.C. 154(b) by 453 days.

(21) Appl. No.: 14/292,397

(22) Filed: May 30, 2014

(65) Prior Publication Data

US 2015/0351254 A1  Dec. 3, 2015

(51) Int. Cl.
| | |
|---|---|
| *B23K 3/04* | (2006.01) |
| *H05K 3/34* | (2006.01) |
| *B23K 1/00* | (2006.01) |
| *F24J 3/00* | (2006.01) |
| *B23K 1/012* | (2006.01) |

(52) U.S. Cl.
CPC ......... *H05K 3/3494* (2013.01); *B23K 1/0016* (2013.01); *B23K 1/012* (2013.01); *F24J 3/00* (2013.01); *H05K 2203/0195* (2013.01); *H05K 2203/081* (2013.01); *H05K 2203/087* (2013.01); *H05K 2203/304* (2013.01)

(58) Field of Classification Search
USPC ................................. 126/263.01; 219/121.46
See application file for complete search history.

(56) References Cited

U.S. PATENT DOCUMENTS

| | | | |
|---|---|---|---|
| 3,916,034 A * | 10/1975 | Tsuchimoto | C23C 14/048 117/102 |
| 4,805,294 A * | 2/1989 | Siemers | B22F 3/115 164/46 |
| 4,838,337 A * | 6/1989 | Siemers | B22F 3/115 164/46 |
| 5,070,228 A * | 12/1991 | Siemers | B23K 10/02 219/121.46 |
| 5,147,465 A | 9/1992 | Maruyama et al. | |
| 5,318,654 A | 6/1994 | Maruyama et al. | |
| 6,197,123 B1 * | 3/2001 | Poag | C23C 16/4405 134/18 |
| 2006/0016396 A1 * | 1/2006 | Kuh | C23C 14/046 118/725 |

(Continued)

*Primary Examiner* — Avinash Savani
(74) *Attorney, Agent, or Firm* — Foley & Lardner LLP

(57) ABSTRACT

A heating apparatus includes a gas supply for providing a base gas, a generator configured to excite the base gas to produce a metastable gas mixture that includes a metastable gas, and a housing. The housing includes a wall shaped to contain the metastable gas mixture and selectively enclose a reactive element of a target component. Interaction between the metastable gas and at least one of a coupling material and the reactive element transfers energy to selectively heat the at least one of the coupling material and the target component.

32 Claims, 14 Drawing Sheets

(56) References Cited

U.S. PATENT DOCUMENTS

2007/0281082 A1* 12/2007 Mokhlesi .......... C23C 16/45527
427/248.1
2008/0124941 A1* 5/2008 Ueda .................. C23C 8/02
438/766
2012/0199735 A1* 8/2012 Krechmer ............. H01J 49/049
250/286

* cited by examiner

METASTABLE GAS HEATING

BACKGROUND

Materials may be heated according to various techniques and for various purposes. By way of example, material may be heated as part of a heat-treating operation, a joining operation, or still another operation. Joining two materials involves heating at least one of the materials or heating an intermediate material. Soldering, brazing, and welding often utilize such intermediate materials, which are heated and subsequently cooled, to couple (e.g., physically attach, electrically join, etc.) the two materials. By way of example, solder is utilized to electrically couple leads or contacts of electronic components with contacts of a circuit board to form a circuit assembly. Circuit assemblies often include a plurality of chips or other electronic components each having a plurality of leads or contacts that are soldered to the circuit board.

Traditional methods for soldering the leads or contacts of electronic components to circuit boards include general heating, vapor condensation, and wave soldering. General heating involves placing the electronic components and solder onto the circuit board and inserting the assembly into an oven. The temperature of the oven is increased until the solder melts and couples the electronic components to the circuit board. This process exposes the entire assembly to the heat of the oven, which may damage heat-sensitive constituents (e.g., electronic components, the circuit board, etc.). Vapor condensation involves introducing a vapor into a chamber that contains the solder, electronic components, and circuit board. The solder is melted as the vapor condenses, which transfers energy into the solder equal to the heat of vaporization. However, temperature control of the vapor may prove difficult, and the vapor may itself pose environmental concerns. Nonetheless, general heating, vapor condensation, and wave soldering remain the primary methods used to couple electronic components to circuit boards.

SUMMARY

One embodiment relates to a heating apparatus. The apparatus includes a gas supply for providing a base gas, a generator configured to excite the base gas to produce a metastable gas mixture that includes a metastable gas, and a housing. The housing includes a wall shaped to contain the metastable gas mixture and selectively enclose a reactive element of a target component. Interaction between the metastable gas and at least one of a coupling material and the reactive element transfers energy to selectively heat the at least one of the coupling material and the target component.

Another embodiment relates to an apparatus for heating reactive elements. The apparatus includes a gas supply for providing a base gas, a generator configured to excite the base gas from the gas supply to produce a metastable gas mixture that includes a metastable gas, a housing shaped to contain the metastable gas mixture and a target component, and a nonreactive material disposed along the target component to define a covered portion and an exposed portion. Interaction between the metastable gas and the exposed portion transfers energy to selectively heat the target component.

Still another embodiment relates to an apparatus for heating reactive elements. The apparatus includes a gas supply for providing a base gas, a generator configured to excite the base gas from the gas supply to produce a metastable gas mixture that includes a metastable gas, an arm including an end, and an actuator coupled to the arm and configured to move the end relative to a reactive element of a target component. The end is shaped to direct the flow of the metastable gas mixture toward the reactive element, interaction between the metastable gas and the reactive element transferring energy to selectively heat the target component.

Yet another embodiment relates to a method for heating a reactive element. The method includes providing a base gas with a gas supply, producing a metastable gas mixture that includes a metastable gas by exciting the base gas with a generator, and selectively heating at least one of a coupling material and a reactive element of a target component with the metastable gas mixture.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
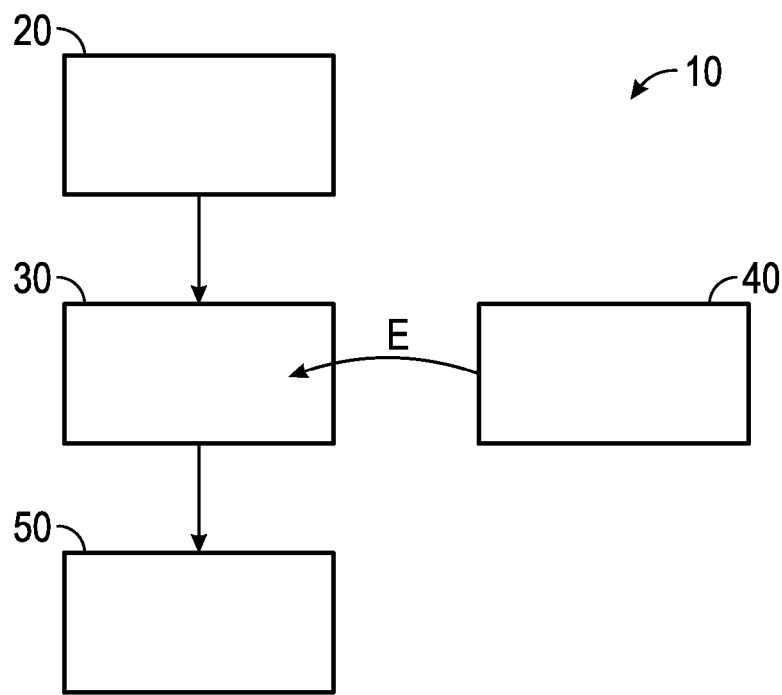
FIG. 1 is a schematic view of a metastable gas heating assembly, according to one embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

According to one embodiment, a target component includes a reactive element (e.g., a metallic part, lead, contact, etc.; a metallic coupling material; etc.) that is heated with a metastable gas heating assembly. In one embodiment, the reactive element is metallic and includes a metallic surface. By way of example, metastable gas (e.g., a gas which, under appropriate conditions, can exist in an energetically excited state for an appreciable period of time before spontaneously returning to its ground (unexcited) state, etc.) may heat at least one of a metallic part and a metallic coupling material (e.g., aluminum-silicon, copper, copper-silver, brass, a nickel alloy, silver, etc.) as part of a brazing operation. By way of another example, the metastable gas may heat at least one of a lead, a bump, a pad, a contact, and a metallic coupling material (e.g., solder) to join components of a circuit assembly in a soldering operation. Energy may be transferred into the reactive element due to interaction between the metastable gas and a reactive surface (e.g., a surface of the metallic part, a surface of the metallic coupling material, etc.). In one embodiment, such a transfer of energy melts the metallic coupling material, thereby fusing two metallic parts (e.g., the parts are brazed together). Examples of applications for the metastable heating include heating a metallic surface to change the properties of the metal. By way of example, the metastable gas heating assembly may be used to flash heat a surface or a material. Such flash heating may be used to at least one of change the crystal structure of the surface or volume of the metal, to facilitate coating a reactive surface with a different material or alloy, and to create a brazed or soldered connection thereby creating at least one of a mechanical and electrical connection (e.g., thereby forming at least part of an electro-optic or a micro-electro-mechanical device for making multiple connections in an electronic circuit assembly). In one embodiment, the metastable gas heating assembly is used to melt solder bumps of a ball grid array to mount an electronic component (e.g., a microprocessor). While this discussion refers primarily to electronic circuit assemblies, the disclosed systems and methods may also be used to heat materials in any of the aforementioned applications, among others.

Referring to the embodiment shown in FIG. 1, a metastable gas heating assembly 10 includes a gas supply 20 that provides a base gas to a container 30. In one embodiment, gas supply 20 is directly attached to container 30. In other embodiments, gas supply 20 is in fluid communication with container 30 with a conduit (e.g., hose, pipe, etc.). In one embodiment, the base gas includes helium. In other embodiments, the base gas includes another noble gas (e.g., neon, argon, krypton, xenon, etc.). In still other embodiments, the base gas includes still another gas. As shown in FIG. 1, metastable gas heating assembly 10 includes a generator 40 that transfers energy into the base gas within container 30. By way of example, generator 40 may include a laser device, a plasma discharge device, a microwave source, an electron cyclotron resonance device, or still another device. The transfer of energy excites the base gas to produce a metastable gas. The metastable gas mixture (e.g., a combination of the base gas and the metastable gas; a combination of the base gas, the metastable gas, and another gas; a combination of the metastable gas and another gas; only metastable gas, etc.) is directed toward a target component 50 to perform a heating operation. In one embodiment, container 30 includes an inlet in fluid communication with gas supply 20 and an outlet in fluid communication with a housing to facilitate directing the metastable gas mixture toward target component 50.

Figure 2:
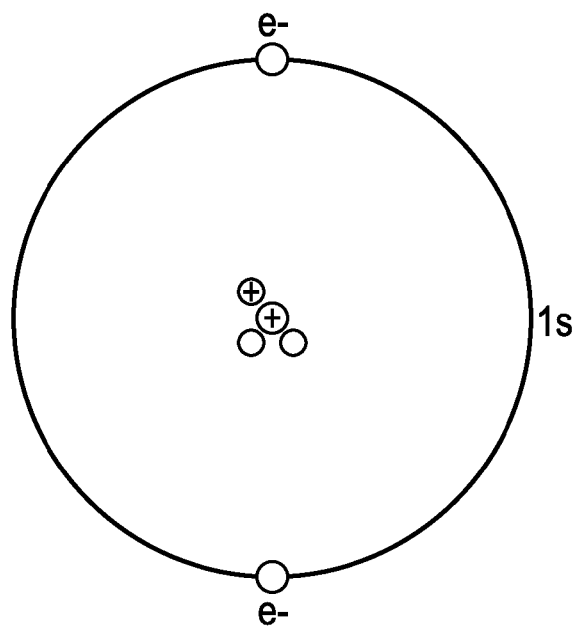
FIGS. 2-3 are schematic views of the ground state and the excited state for helium.
Figure 3:
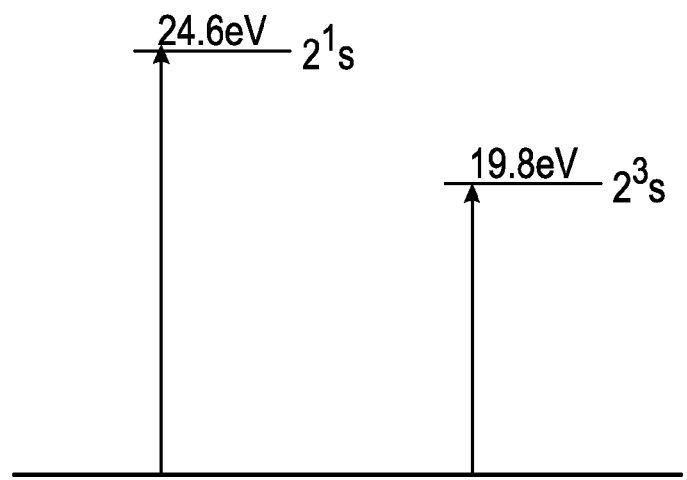

Referring next to FIGS. 2-3, electrons of the base gas may be excited from a ground state into higher energy levels. In a ground state, electrons of the base gas sequentially fill energy levels. Atomic energy levels having lower energies are filled first, leaving higher energy levels unfilled. The energy level is denoted with a principal energy level number, n (e.g., 1, 2, 3, etc.). Various orbitals are associated with each energy level (e.g., the s orbital, the p orbital, etc.). Electrons are identified according to their particular energy level and orbital. By way of example, a hydrogen atom may have a single electron in the s orbital of the lowest energy level, denoted $1s^1$. As shown in FIG. 2, a helium atom has two electrons in the s orbital of the lowest energy level, denoted $1s^2$.

In one embodiment, the generator excites the electrons of the base gas into a higher energy level. By way of example, the base gas may include helium, and an electron of a helium atom may be excited into the 2s, 2p, 3s, or 3p energy level, among others. While several excited states of Helium are unstable (i.e. the electrons quickly return to their ground state location), the 2s and the 3p excited states, among others, are metastable (i.e. such that the electrons may remain in an excited state for a prolonged period of time). The 2s excited state includes both the $2^1s$ and the $2^3s$ excited states for electrons having spin directions that are anti-parallel and parallel, respectively. As shown in FIG. 3, a helium electron may be excited into the $2^1s$ and the $2^3s$ orbitals with the introduction of 24.6 electron volts and 19.8 electron volts of energy, respectively. In other embodiments, the base gas includes another gas (e.g., hydrogen, nitrogen, neon, argon, etc.), electrons of such gas molecules excited by generator 40 to produce the metastable gas.

According to one embodiment, target component 50 includes a reactive element having a reactive surface. Interaction between the metastable gas and the reactive surface de-excites the metastable gas, electrons of the metastable gas exchanging energy with the electrons of the reactive element (e.g., 24.6 electron volts for helium $2^1s$ electrons, 19.8 electron volts for helium $2^3s$ electrons, etc.). The transfer of energy increases the temperature of the reactive element (i.e. the metastable gas heats the reactive element). In some embodiments, the de-excited metastable gas forms the base gas. Absent interaction with a reactive surface, the metastable gas may remain excited for more than two hours. According to one embodiment, the de-excited metastable gas mixture is exhausted to an outside environment. According to another embodiment, the de-excited metastable gas mixture is collected (e.g., in a container) for disposal or reuse. In one embodiment, the entire de-excited metastable gas mixture is collected for reuse. In another embodiment, only a portion of the de-excited metastable gas mixture (e.g., helium, etc.) is collected for reuse.

In some embodiments, target component 50 includes both reactive elements and nonreactive elements. The metastable gas may remain excited even after interaction with the nonreactive elements of target component 50. In one embodiment, the metastable gas selectively heats reactive elements of target component 50 without directly heating the nonreactive elements of target component 50. Such selective heating may protect nonreactive elements from exposure to increased temperatures, thereby reducing the risk of damage during a manufacturing process.

Figure 4:
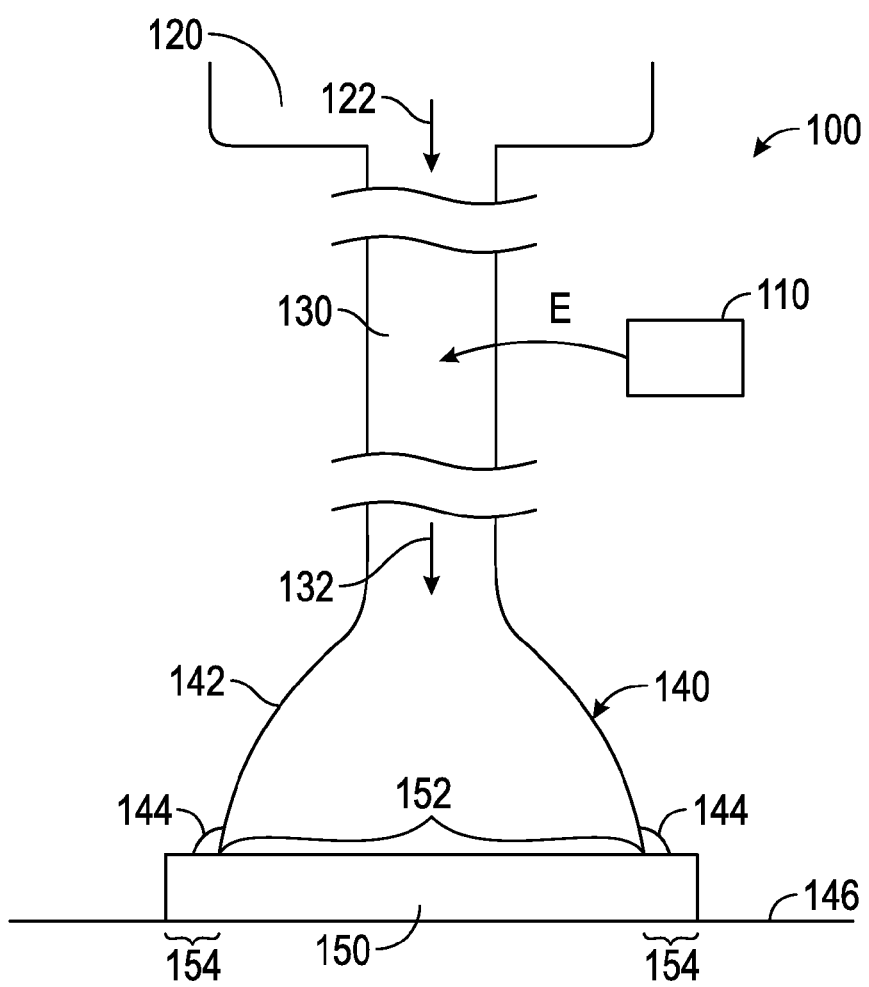
FIG. 4-5 are side plan views of a metastable gas heating assembly including a housing, according to one embodiment.
Figure 5:
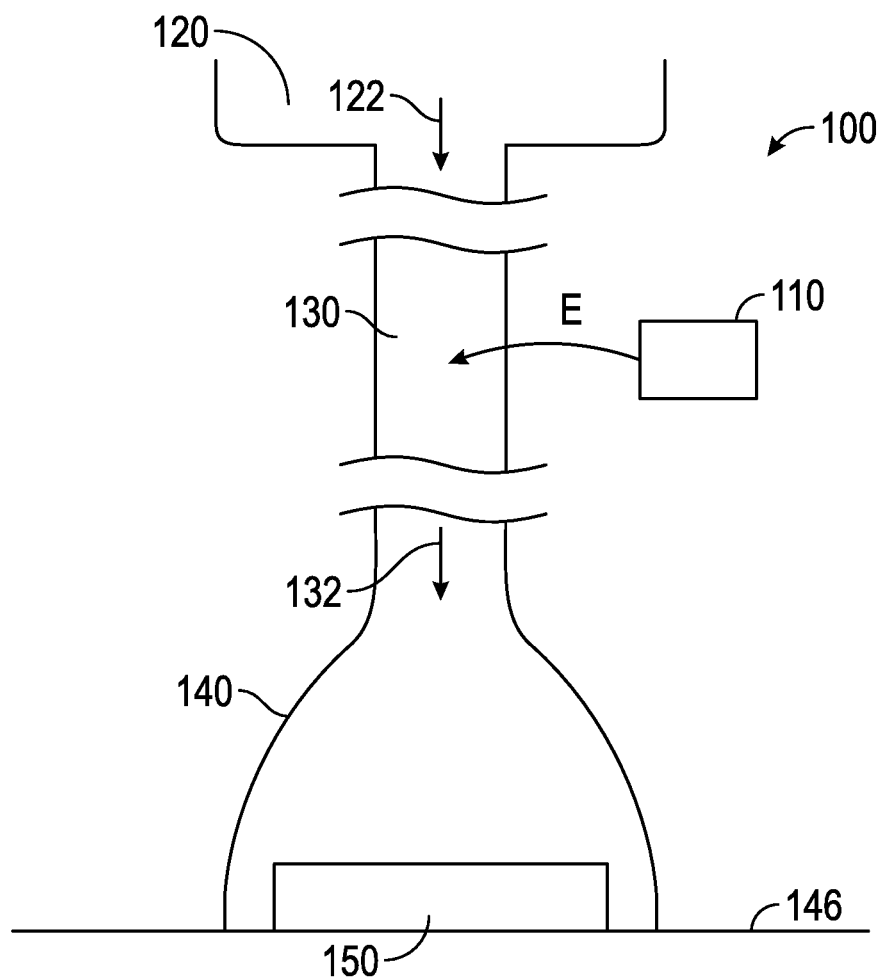

Referring next to the embodiment shown in FIGS. 4-5, a metastable gas heating assembly 100 includes a generator 110 that produces a metastable gas mixture from a base gas. According to the embodiment shown in FIGS. 4-5, the base gas is provided by a gas supply 120. The base gas may include helium, another noble gas, or still another gas. As shown in FIGS. 4-5, the base gas flows along flow direction 122 and into a chamber 130. In one embodiment, generator 110 transfers energy into the base gas to produce the metastable gas mixture. As shown in FIGS. 4-5, generator 110 transfers energy into the base gas to produce the metastable gas within chamber 130. From chamber 130, the metastable gas mixture (e.g., a combination of the base gas and the metastable gas; a combination of the base gas, the metastable gas, and another gas; a combination of the metastable gas and another gas, only metastable gas; etc.) flows along flow direction 132 into a housing, shown as hood 140. In one embodiment, chamber 130 is directly attached to hood 140. In other embodiments, chamber 130 is in fluid communication with hood 140 with a nonreactive conduit (e.g., hose, pipe, etc.). According to another embodiment, generator 110 produces the metastable gas mixture within hood 140. By way of example, the base gas may flow from gas supply 120, through chamber 130, and into hood 140, where generator 110 produces metastable gas mixture therefrom. By way of another example, the base gas may flow from gas supply 120 and into hood 140, where generator 110 produces metastable gas mixture therefrom. Gas supply 120 may be directly coupled (e.g., integrally formed with, attached, etc.) to hood 140 to facilitate such flow.

Referring still to FIGS. 4-5, hood 140 interfaces with (e.g., engages, contacts, abuts, encloses, etc.) a target component 150. Metastable gas heating assembly 100 generates a metastable gas mixture to heat at least a portion of target component 150. In one embodiment, hood 140 includes a wall, shown as sidewall 142, shaped to contain the metastable gas mixture. Sidewall 142 may direct the metastable gas mixture toward at least a portion of target component 150. In one embodiment, hood 140 includes a material that does not deactivate the metastable gas mixture (e.g., a polymeric material, a ceramic material, etc.).

As shown in FIG. 4, sidewall 142 of hood 140 is shaped to selectively enclose a designated portion 152 of target component 150. Selective enclosure of designated portion 152 facilitates exposing only a portion of target component 150 to the metastable gas mixture, thereby leaving a peripheral area 154 of target component 150 unaffected by the metastable gas mixture. In one embodiment, target component 150 selectively encloses a reactive element of target component 150 (e.g., a metallic part, lead, pad, bump, contact, etc.; a metallic coupling material; etc.). By way of example, target component 150 may be a metal plate having a reactive element (e.g., component, part, surface, etc.) that is selectively enclosed by sidewall 142. According to the embodiment shown in FIG. 4, a seal 144 is disposed at an end of sidewall 142 to reduce the risk of inadvertently exposing peripheral area 154 of target component 150 to the metastable gas mixture. In one embodiment, seal 144 extends around the periphery of sidewall 142. As shown in FIG. 5, hood 140 is shaped to enclose the entirety of target component 150. Such enclosure may expose the entirety of target component 150 to the metastable gas mixture.

Hood 140 may have a shape that directs the metastable gas mixture toward target component 150. In some embodiments, hood 140 is shaped to facilitate the flow of metastable gas mixture toward target component 150 (e.g., shaped to reduce turbulence within the flow of metastable gas mixture, etc.). In other embodiments, hood 140 is shaped to target a specific reactive element of target component 150. According to the embodiment shown in FIGS. 4-5, hood 140 is bell-shaped. In other embodiments, hood 140 has another shape (e.g., cylindrical, hemispherical, cubic, etc.).

As shown in FIGS. 4-5, target component 150 is positioned on a surface, shown as backing surface 146. In other embodiments, target component 150 is spaced (e.g., angularly offset, elevated, etc.) from backing surface 146 such that the metastable gas mixture interfaces with a top and a bottom side of target component 150. In some embodiments, backing surface 146 is a portion of a larger assembly to which target component 150 belongs. In other embodiments, backing surface 146 is provided as part of metastable gas heating assembly 100 to engage target component 150. By way of example, backing surface 146 may support target component 150 during a heating operation.

In other embodiments, backing surface 146 is heated or cooled to increase or decrease the temperature of target component 150. Increasing the temperature of target component 150 may reduce a heating load for the metastable gas mixture (i.e. the requisite amount of metastable gas mixture needed to increase the temperature of a reactive element of target component 150). In some embodiments, backing surface 146 has a uniform temperature gradient. In other embodiments, backing surface 146 includes a non-uniform temperature profile to selectively heat or cool target component 150 (e.g., to control the thermal expansion or contraction of target component 150). By way of example, target component 150 may be a circuit assembly, and backing surface 146 may be selectively cooled to reduce the temperature of various electronic components while increasing the temperature of areas surrounding reactive elements (e.g., metallic parts, leads, pads, bumps, contacts, etc.; metallic coupling materials; etc.) to facilitate a joining operation.

Figure 6A:
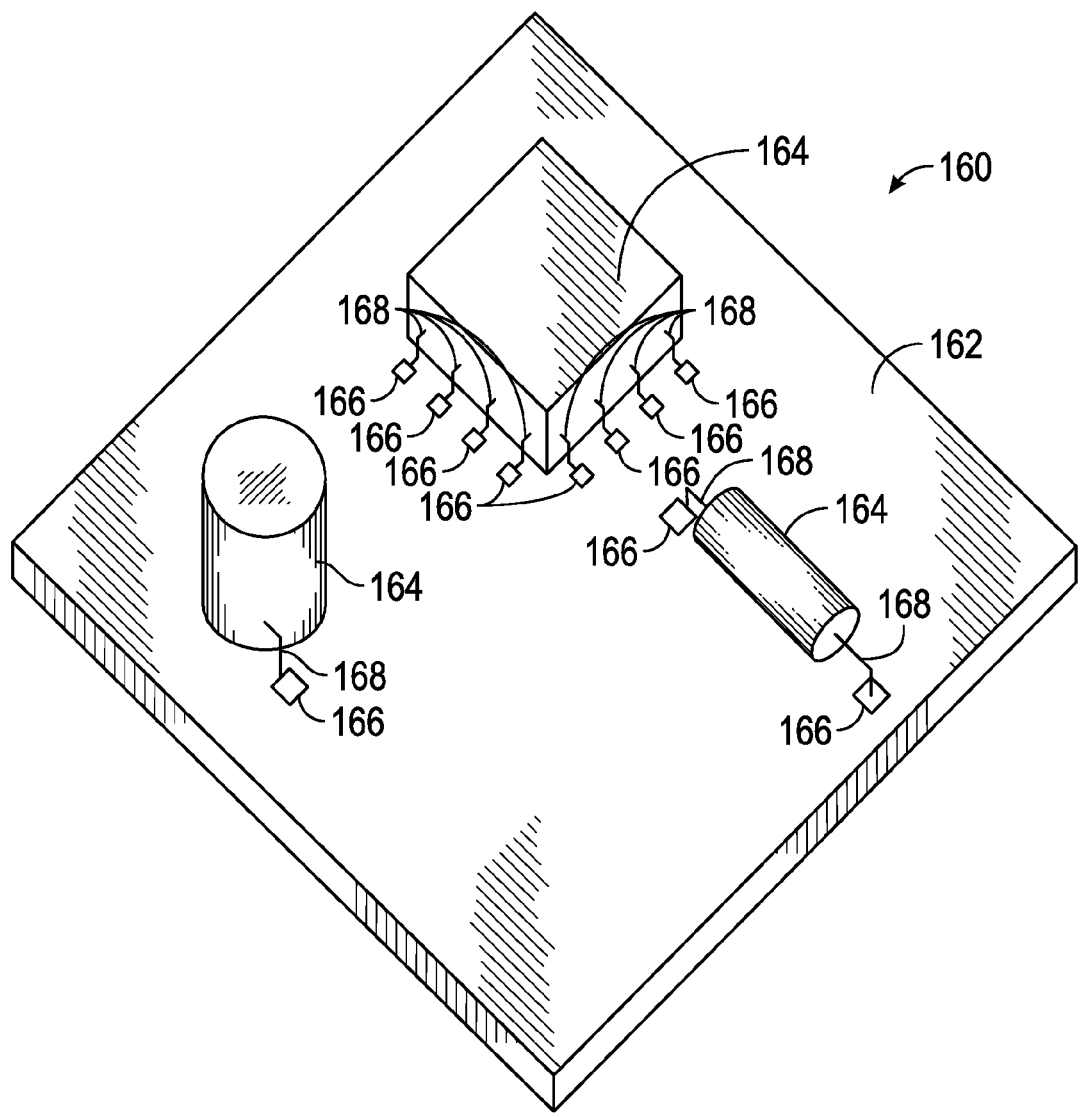
FIG. 6A is an elevation view of a target component, according to one embodiment.
Figure 6B:
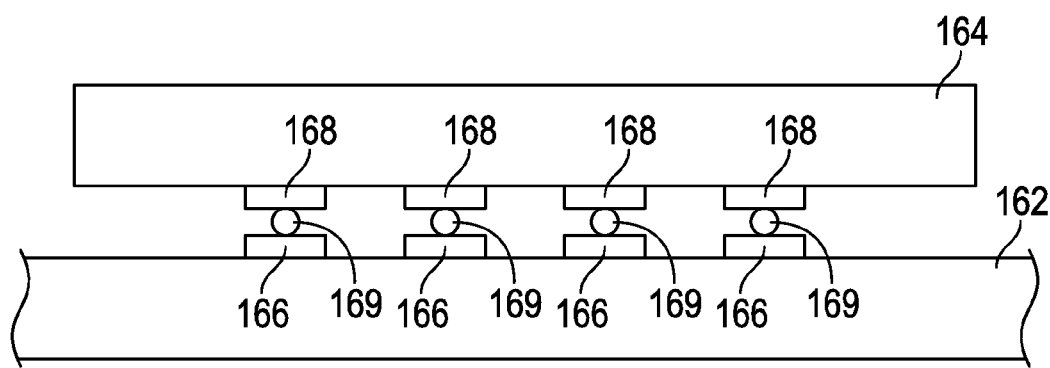
FIG. 6B is a sectional view of a target component having contacts that are not readily accessible or visible, according to one embodiment.

Referring next to FIGS. 6A-10, a target component, shown as circuit assembly 160, includes a substrate, shown as circuit board 162, and a plurality of electronic components 164. Circuit board 162 may include a plurality of conductive paths disposed on a substrate. As shown in FIG. 6A, electronic components 164 include various types of electrical devices (e.g., processor chips, capacitors, diodes, etc.). According to one embodiment, circuit board 162 includes a plurality of reactive elements, shown as contacts 166, that are configured to interface with a plurality of reactive elements on electronic components 164, shown as leads 168. While shown as elements protruding from electronic components 164, leads 168 may be contact patches, pads, bumps, or still other elements (e.g., metallic contact patches) on an electronic component (e.g., a microprocessor) that engage contacts 166 (e.g., as part of a ball grid array mounting arrangement). by way of example, the contact patches may be positioned below the electronic component and engage corresponding contacts on circuit board 162. Engagement between contacts 166 and leads 168 couples electronic components 164 to circuit board 162. By way of example, engagement between contacts 166 and leads 168 may electrically couple electronic components 164 to circuit board 162. By way of another example, engagement between contacts 166 and leads 168 may physically secure electronic components 164 to circuit board 162. In other embodiments, fasteners (e.g., screws, latches, interengaging prongs, a snap fit, etc.) physically secure electronic components 164 to circuit board 162. While shown in FIG. 6A with a few electronic components 164 positioned on circuit board 162, circuit assembly 160 may include a flip chip attached to a ball grid array substrate, which may itself be attached to a circuit board with ball grid array solder balls, a plurality of stacked chips, or a multi-chip module, the various electronic components thereof having a large number of contacts that may be connected (e.g., in one operation) using a metastable gas heating assembly. By way of example, the electronic components may be coupled using a ball grid array, where the contacts on the electronic components and the substrate are positioned below the electronic components. Such contacts may be not visible or readily accessible. FIG. 6B shows such an arrangement of components. As shown in FIG. 6B, leads 168 are raised from the bottom surface of electronic component 164, and contacts 166 are raised from the upper surface of circuit board 162. In other embodiments, leads 168 and contacts 166 may be recessed for flush with the surfaces of electronic component 164 and circuit board 162. As shown in FIG. 6B, coupling materials 169 (e.g., solder bumps, solder balls, etc.) are used to couple leads 168 with contacts 166. In one embodiment, a metastable gas heating assembly melts coupling materials 169 to couple (e.g., electrically, mechanically, etc.) electronic component 164 with circuit board 162.

Figure 7:
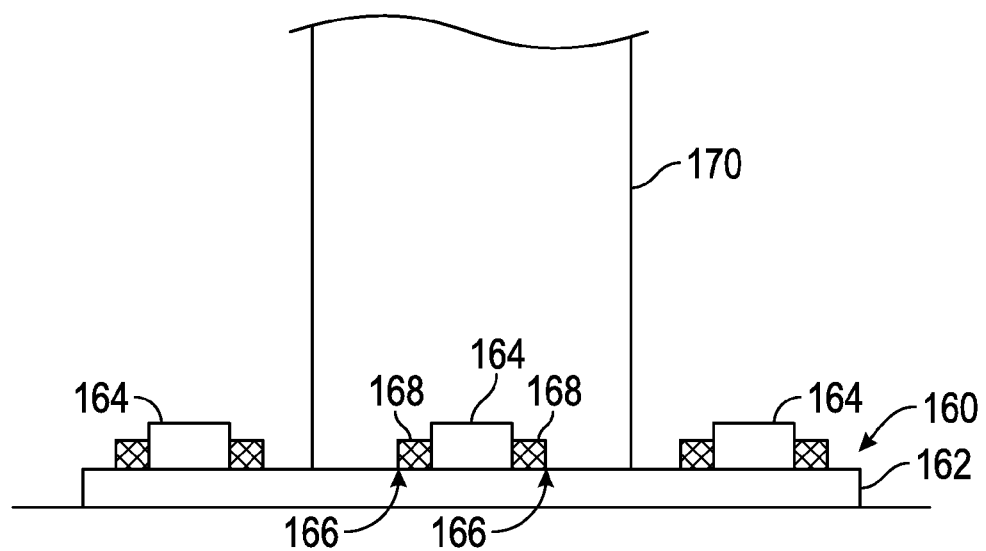
FIGS. 7-8 are side plan views of a housing shaped to at least partially enclose a target component, according to various embodiments.
Figure 8:
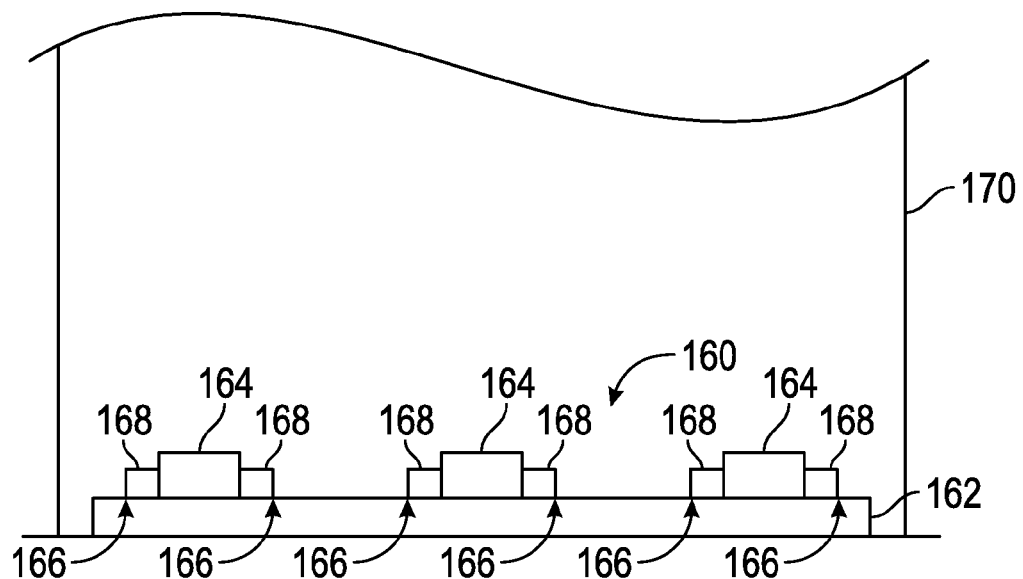

As shown in FIGS. 7-8, a housing, shown as hood 170 includes a wall shaped to at least partially enclose circuit assembly 160. In some embodiments, hood 170 is shaped to contain a metastable gas mixture therein. The metastable gas mixture may be provided to hood 170 or formed within hood 170, according to various embodiments. As shown in FIG. 7, hood 170 selectively encloses a subset of the electronic components 164 and the reactive elements associated therewith (e.g., leads 168 coupled to electronic component 164, contacts 166 associated with leads 168, etc.). A hood 170 that selectively encloses a subset of electronic components 164 facilitates the selective heating of the enclosed reactive elements (e.g., metallic parts, leads, contacts, etc.; metallic coupling materials; etc.) by a metastable gas mixture. Such selective heating facilitates installing or removing a subset of electronic components 164 (e.g., a single electronic component 164, a group of electronic components 164, etc.) without installing or removing the remaining electronic components 164 (i.e. the reactive elements of a single electronic component 164 may be heated without heating the reactive elements of adjacent electronic components). Individual removal of a subset of electronic components 164 may facilitate rework of circuit assemblies that do not satisfy the various criteria therefore. In one embodiment, one or more contacts of electronic component 164 may be tack-soldered or tack-brazed, and the remaining contacts may be coupled to circuit board 162 with the metastable gas heating assembly. A non-reactive material may be positioned over the tack-soldered or tack-brazed contacts to prevent them from interfacing with the metastable gas mixture. As shown in FIG. 8, hood 170 is shaped to contain a metastable gas mixture and enclose the entirety of circuit assembly 160. Such entire enclosure facilitates the collective installation or removal of electronic components 164.

Figure 9:
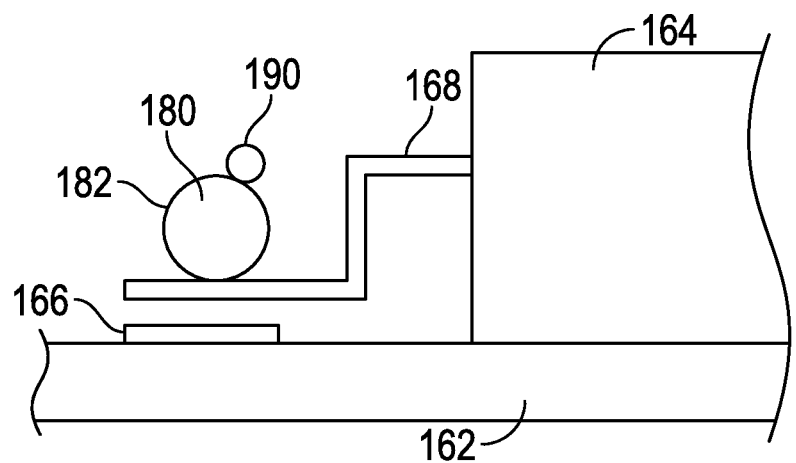
FIGS. 9-10 are detail side plan views of a contact, a lead, and a coupling material, according to various embodiments.

During operation of a metastable gas heating assembly, metastable gas within hood 170 heats the enclosed reactive elements (e.g., contacts 166, leads 168, a metallic coupling material, etc.). A metastable gas heating assembly heats reactive elements that are directly exposed and those that may be difficult to access with traditional heating devices (e.g., a soldering iron, etc.) or even modern selective heating means such as laser or electron beam welders. By way of example, the metastable gas mixture may permeate into an inner volume of electronic component 164, to an opposing side of electronic component 164, or to an opposing side of circuit board 162. As shown in FIG. 9, electronic component 164 and contact 166 are both positioned on a first side of circuit board 162. In other embodiments, electronic component 164 is positioned on a first side of circuit board 162, and lead 168 protrudes through an aperture within circuit board 162 to engage contact 166 on an opposing second side of circuit board 162. The metastable gas heating assembly may facilitate heating reactive elements positioned on the opposing second side of circuit board 162. In one embodiment, circuit board 162 includes an aperture through which the metastable gas mixture flows to interface with the reactive element on the opposing second side of circuit board 162. In another embodiment, the metastable gas heating assembly includes a support to elevate circuit board 162 such that the metastable gas mixture may flow around the periphery of circuit board 162 and heat reactive elements positioned on the opposing second side. In still another embodiment, the metastable gas heating assembly directs metastable gas mixture to both opposing sides of circuit board 162. By way of example, hood 170 may split into two portions (e.g., tubular portions) for exposing the first and second opposing sides of circuit board 162 to the metastable gas mixture. In still other embodiments, hood 170 is used to facilitate a continuous or semi continuous heating process whereby circuit assemblies 160 are heated and removed from hood 70 (e.g., with an actuator that drives a belt or other moveable element). Hood 70 may be effectively sealed with a brush or another flexible seal that extends toward the belt and contains the metastable gas mixture. In other embodiments, hood 70 includes doors or other components that open and close to facilitate a batch heating operation with the metastable gas heating assembly. In still other embodiments, hood 70 includes liquid locks, aerodynamic seals, or other devices configured to retain the metastable gas mixture in a desired region.

Figure 10:
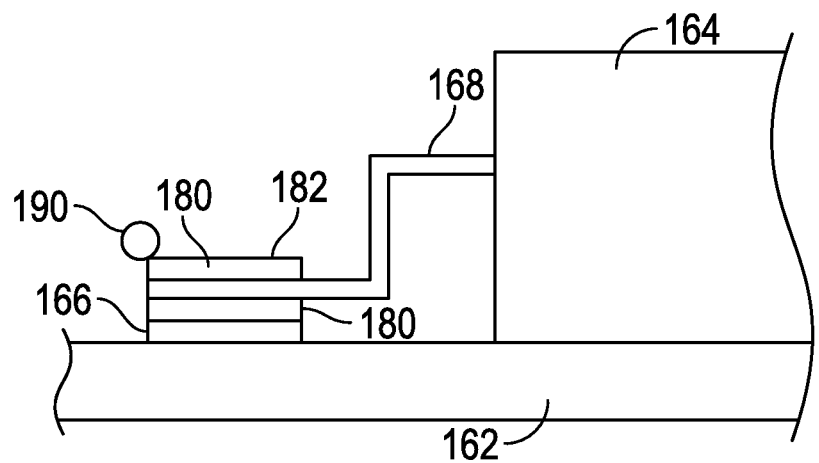

As shown in the detail views of FIGS. 9-10, a reactive element, shown as metallic coupling material 180, is heated by a metastable gas atom 190. In one embodiment, metallic coupling material 180 includes solder (e.g., eutectic solder having a sharp melting point). As shown in FIGS. 9-10, metallic coupling material 180 has a reactive surface 182. By way of example, reactive surface 182 may be a metallic surface. In some embodiments, contact 166 and lead 168 also include reactive surfaces. Metastable gas atom 190 may react with reactive surface 182 to conductively heat metallic coupling material 180. In one embodiment, the free electrons at reactive surface 182 de-activate metastable gas atom 190, thereby transferring the energy from the excited electrons of metastable gas atom 190 into metallic coupling material 180. Such a transfer of energy increases the temperature of metallic coupling material 180.

Referring still to FIGS. 9-10, metallic coupling material 180 is positioned to couple contact 166 and lead 168 after reaching a threshold temperature (e.g., a melting temperature of the coupling material). Metallic coupling material 180 may be shaped as a bump, a ball, a paste, or metallic coupling material 180 may have still another shape. As shown in FIG. 9, metallic coupling material 180 is positioned above contact 166 and lead 168. As shown in FIG. 10, metallic coupling material 180 is initially disposed along contact 166 and lead 168. According to one embodiment, interaction between metastable gas atom 190 and reactive surface 182 melts metallic coupling material 180 thereby coupling electronic component 164 to circuit board 162. According to another embodiment, metastable gas atom 190 interacts with contact 166 and lead 168 to facilitate melting metallic coupling material 180. In other embodiments, a non-metallic coupling material (e.g., an adhesive, an epoxy, etc.) is positioned to provide a mechanical connection. In still other embodiments, the coupling material is less reactive with the metastable gas than contact 166 and lead 168. In still other embodiments, the coupling material is a layer (e.g., a continuous layer) of solder paste covered in a nonreactive material such that the solder paste only melts and forms a contact at the points where a heated metal pad (e.g., a heated metal contact 166 or lead 168) touches the paste. The remaining solder paste may be washed away. In yet another alternative embodiment, electronic component 164 is covered with a nonreactive material (e.g., covering even the bonding pads, leads, or contacts to prevent corrosion), and a coupling material (e.g., screen-printed solder bumps) are selectively heated by the metastable gas and melt through the nonreactive material, thereby creating a plurality of interface joints.

Figure 11:
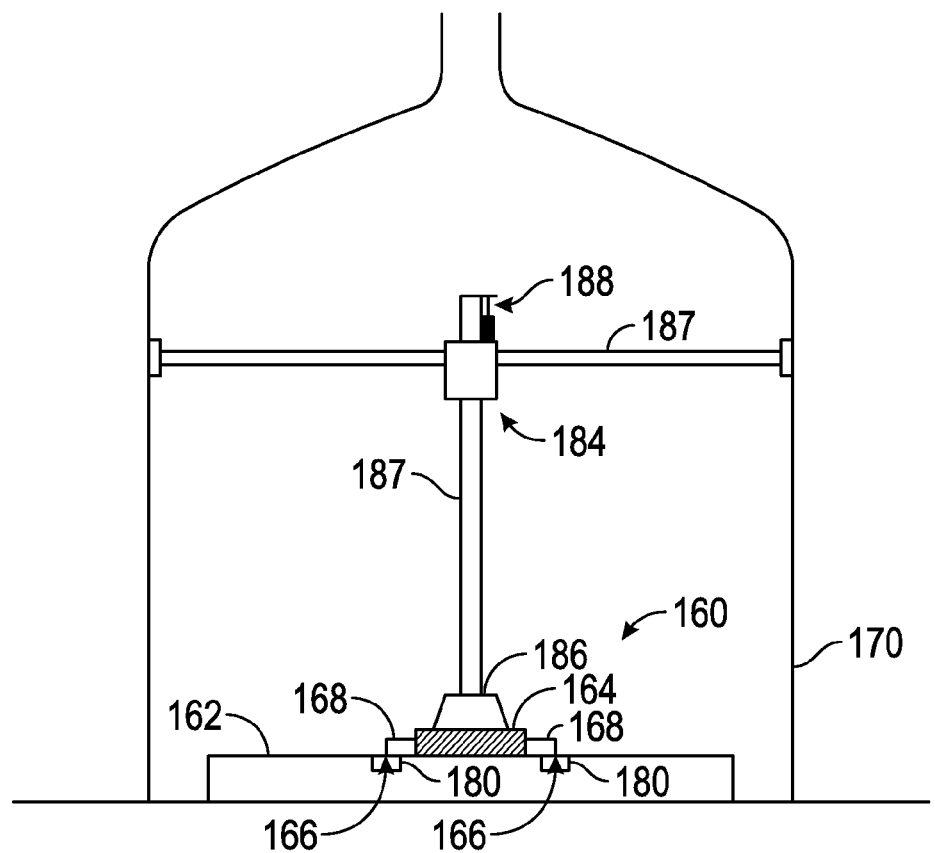
FIG. 11 is a side plan view of a device configured to facilitate the installation or removal of an electronic component, according to one embodiment.

Referring next to the embodiment shown in FIG. 11, a metastable gas heating assembly includes a device, shown as assembly 184, configured to facilitate the installation or removal of electronic component 164. As shown in FIG. 11, assembly 184 is positioned within hood 170. Positioning assembly 184 within hood 170 may reduce the risk of inadvertent emission of the metastable gas mixture (e.g., to an unenclosed portion of circuit assembly 160, to a surrounding environment, etc.).

In one embodiment, assembly 184 is a removal device configured to interface with electronic component 164 during an extraction procedure (i.e. assembly 184 may be used to extract existing electronic components from circuit board 162). By way of example, the extraction procedure may include heating metallic coupling material 180 with a metastable gas mixture and removing electronic component 164 with assembly 184. Such a procedure may be used to reattach or remove electronic components 164 without damaging other electronic components 164 (e.g., as part of a re-work operation). As shown in FIG. 11, assembly 184 includes an engagement device, shown as suction cup 186, movably coupled to a plurality of rods 187. In other embodiments, the engagement device is a grabber, an arm, a tine, or other device configured to engage electronic component 164.

According to the embodiment shown in FIG. 11, assembly 184 includes an actuator, shown as actuator 188. In one embodiment, actuator 188 includes a linear actuator positioned to engage rod 187 and apply a force to suction cup 186. In other embodiments, actuator 188 includes another type of actuator (e.g., a rotational actuator) or is otherwise positioned. As shown in FIG. 11, actuator 188 is configured to apply a tensile force to metallic coupling material 180 (e.g., by way of leads 168). Assembly 184 may apply a tensile force on metallic coupling material 180 as the metastable gas mixture interfaces with at least one of metallic coupling material 180, contact 166, and lead 168. In one embodiment, metallic coupling material 180 softens as it receives energy from the metastable gas until assembly 184 extracts electronic component 164 from circuit board 162.

Figure 12:
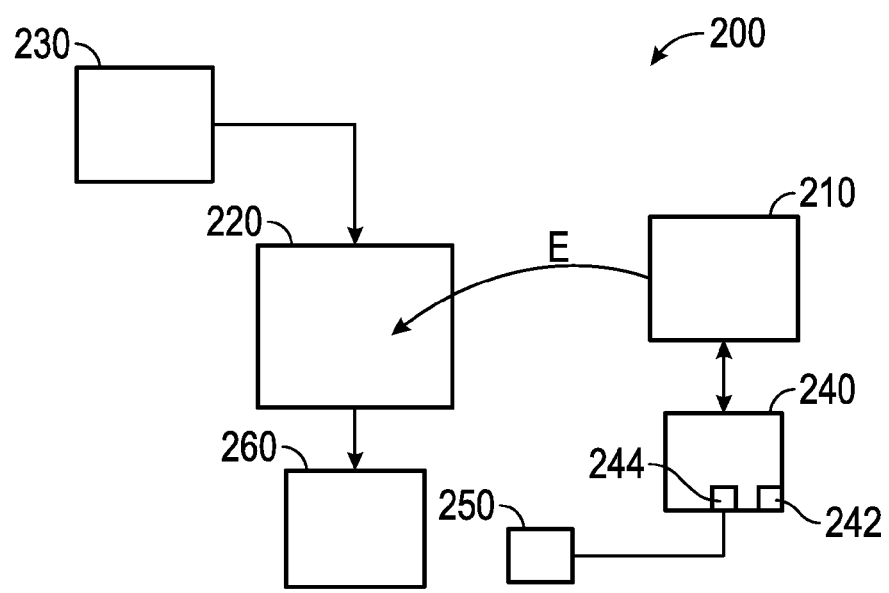
FIG. 12 is a schematic view of a metastable gas heating assembly including a processing circuit and a sensor, according to one embodiment.

Referring next to FIG. 12, a metastable gas heating assembly 200 includes a generator 210 that produces a metastable gas mixture within a container 220, when engaged. Generator 210 produces the metastable gas from a base gas provided by a gas supply 230. As shown in FIG. 12, metastable gas heating assembly 200 includes a processing circuit 240 that interfaces with generator 210. In one embodiment, processing circuit 240 engages and disengages generator 210 upon receiving an event signal, thereby controlling the production of the metastable gas mixture within container 220. In one embodiment, disengaging generator 210 upon receiving the event signal reduces the production of the metastable gas mixture. By way of example, reducing the production of the metastable gas mixture may reduce the transfer of energy into reactive elements of a target component 260 (e.g., to reduce the risk of overheating target component 260, to facilitate the removal of target component 260 after a heating operation is complete, etc.).

The event signal is produced by a switch, according to one embodiment. A user may engage the switch to trigger the production of the metastable gas mixture. In other embodiments, the switch is automatically engaged (e.g., as part of an automated manufacturing process, etc.). According to another embodiment, processing circuit 240 includes a timer module 242 configured to produce the event signal. By way of example, timer module 242 may produce the event signal after a predetermined period of time, the processing circuit 240 disengaging generator 210 upon receiving the event signal from timer module 242.

According to the embodiment shown in FIG. 12, metastable gas heating assembly 200 includes a sensor 250 that is configured to provide sensor signals to processing circuit 240. In one embodiment, sensor 250 is positioned to determine a property of a target component 260. Processing circuit 240 includes a sensor module 244 configured to produce the event signal (e.g., to trigger the disengagement of generator 210) as the sensor signals exceed a threshold value, according to one embodiment.

In one embodiment, sensor 250 is a temperature sensor positioned to determine a temperature of target component 260. The threshold value may be a maximum allowable temperature for a reactive element of target component 260 (e.g., a surface, a contact, a lead, a metallic coupling material, a metallic part, etc.). In other embodiments, the threshold value is a maximum allowable temperature for a nonreactive element of target component 260 (e.g., the body of a processor chip, capacitor, diode, etc.). Sensor 250 may include a contact sensor configured to abut a surface of target component 260, a non-contact sensor (e.g., an infrared sensor) configured to remotely engage a surface of target component 260, or still another device.

According to another embodiment, sensor 250 includes an electrical sensor coupled to target component 260. By way of example, the electrical sensor may be coupled to a contact of a circuit board (e.g., directly, through a plurality of intermediate electrical paths, etc.) and to a lead or contact of an electrical component. Sensor module 244 may determine when an electrical property (e.g., conductivity, resistivity, etc.) reaches a threshold value and send the event signal. In one embodiment, reaching the threshold value indicates that the various reactive elements of target component 260 are coupled. By way of example, the resistance across a lead or contact of an electronic component and the contact of the circuit board may be reduced as a coupling material fills intermediate voids there between.

According to still another embodiment, sensor 250 is configured to provide a sensing signal that relates to a concentration of the metastable gas. By way of example, sensor 250 may be positioned within a flow of the metastable gas mixture between container 220 and target component 260. In one embodiment, sensor 250 is a thermocouple having an end disposed within a flow of the metastable gas mixture. The temperature of a portion of the thermocouple may increase in a manner that relates to the concentration of the metastable gas, the temperature signal provided by the thermocouple thereby relating to the concentration of the metastable gas within the metastable gas mixture. In one embodiment, processing circuit 240 adjusts generator 210 based on the sensing signal (e.g., temperature signal) provided by sensor 250. By way of example, processing circuit 240 may increase or decrease the production of metastable gas from generator 210 where the concentration of metastable gas within the metastable gas mixture is below or above a threshold concentration (e.g., a threshold point, a threshold range, etc.), respectively.

Figure 13:
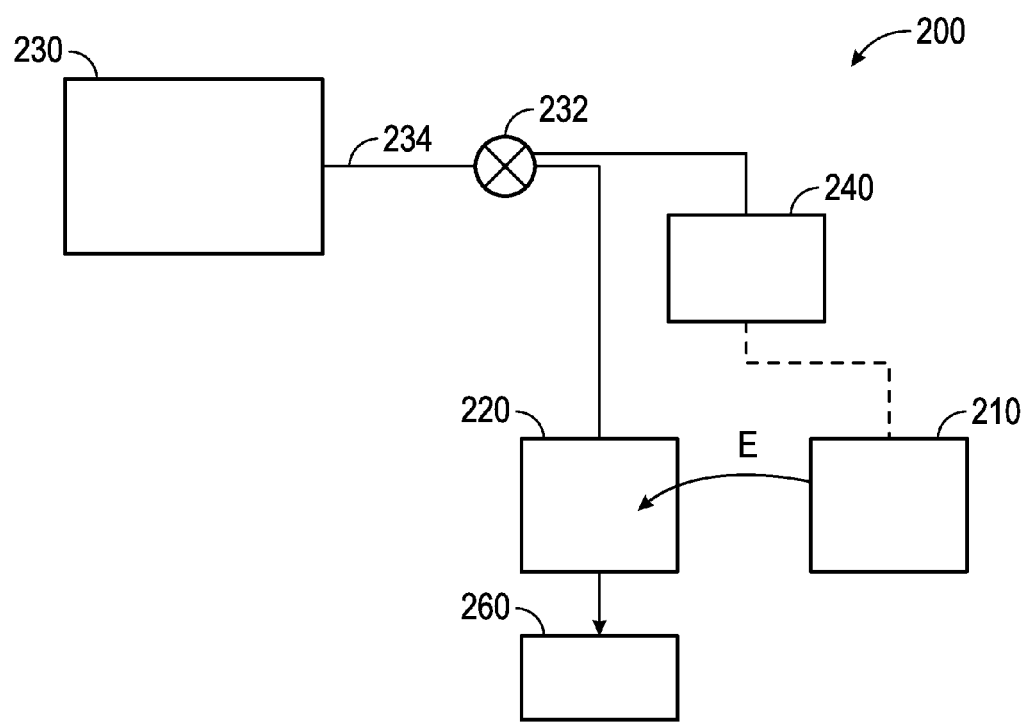
FIG. 13 is a schematic view of a metastable gas heating assembly including a controlled valve positioned to interrupt the flow of a base gas, according to one embodiment.

Referring next to the embodiment shown in FIG. 13, gas supply 230 includes a valve 232 positioned within a conduit 234. Valve 232 may be a regulator or a flow controller (i.e., valve 232 may produce a constant output pressure or a constant mass flow when open, independent of the pressure of the gas supply upstream of valve 232). In one embodiment, closing valve 232 restricts the flow of base gas from gas supply 230, thereby reducing the production of the metastable gas mixture. Processing circuit 240 may also adjust an operating parameter of generator 210 (e.g., adjust a current provided thereto, otherwise adjust a power level thereof, etc.). By way of example, restricting the flow of base gas and adjusting the operating parameters of generator 210 may reduce the transfer of energy into reactive elements of target component 260 (e.g., to reduce the risk of overheating target component 260, to facilitate the removal of target component 260 after a heating operation is complete, etc.). As shown in FIG. 13, conduit 234 couples gas supply 230 with container 220. In one embodiment, valve 232 is configured to allow for gas flow when open and restrict gas flow when closed. According to another embodiment, valve 232 is provided in a conduit between container 220 and target component 260. Valve 232 positioned between container 220 and target component 260 may restrict the flow of metastable gas, thereby reducing the transfer of energy into reactive elements of target component 260.

As shown in FIG. 13, processing circuit 240 is coupled to valve 232. Valve 232 may include a solenoid to open and close a valve gate upon communicating with processing circuit 240. In one embodiment, processing circuit 240 sends a signal to close valve 232 upon receiving an event signal (e.g., from a timer module, from a sensor module in communication with a sensor, etc.). As shown in FIG. 13, processing circuit 240 may be coupled to generator 210. Processing circuit 240 sends a signal to disengage generator 210 upon receiving the event signal, according to one embodiment. Closing valve 232 and disengaging generator 210 further reduces the risk of transferring energy into reactive elements of target component 260.

Figure 14:
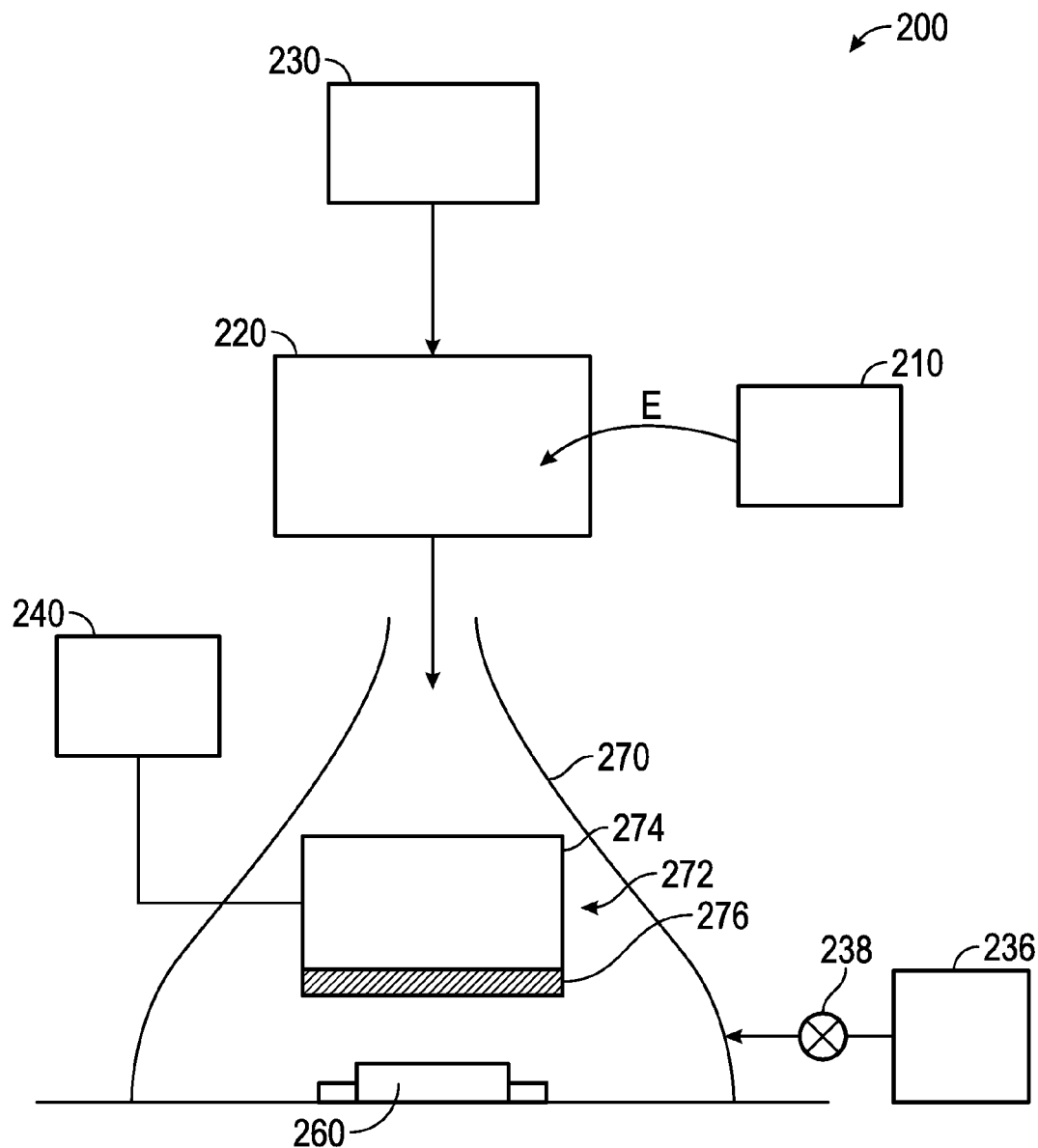
FIG. 14 is a side plan view of a metastable gas heating assembly including a discharge assembly and a secondary gas supply, according to one embodiment.

Referring next to FIG. 14, metastable gas heating assembly 200 includes a housing, shown as hood 270, that encloses target component 260. The metastable gas mixture flows from container 220 into an inner volume of hood 270 where it interfaces with reactive elements of target component 260. As shown in FIG. 14, a discharge assembly, shown as discharge assembly 272, is positioned along the inner volume of hood 270. Discharge assembly 272 reduces the prevalence of the metastable gas within the inner volume of hood 270, thereby reducing the transfer of energy into reactive elements of target component 260 (e.g., to reduce the risk of overheating target component 260, to facilitate the removal of target component 260 after a heating operation is complete, etc.). In one embodiment, discharge assembly 272 de-excites any residual metastable gas before the gas mixture is exhausted or collected for re-use. Discharge assembly 272 is coupled to processing circuit 240, as shown in FIG. 14. In some embodiments, processing circuit 240 engages discharge assembly 272 upon receiving an event signal (e.g., from a timer module, from a sensor module in communication with a sensor, etc.).

Referring still to the embodiment shown in FIG. 14, discharge assembly 272 includes a cover 274 disposed over a discharge element 276. In other embodiments, discharge assembly 272 does not include cover 274. By way of example, at least a portion of discharge assembly 272 (e.g., discharge element 276, etc.) may be disposed along an exhaust flow path and configured to de-excite any residual metastable gas before the gas mixture is exhausted or collected for re-use. As shown in FIG. 14, discharge element 276 is a flat plate. In other embodiments, discharge element 276 is tubular or otherwise shaped. Discharge element 276 may include a screen (e.g., a stack of screens, etc.) or may be still another arrangement of material (e.g., a wire wool, etc.). Discharge element 276 may be disposed along an inner wall of hood 270, disposed along a wall of an exhaust, or disposed within an exhaust flow path (e.g., screens positioned orthogonal or otherwise across an exhaust flow path, wire wool disposed within an exhaust pipe, etc.), according to various embodiments. According to one embodiment, cover 274 is a nonreactive material that does not interface with the metastable gas, while discharge element 276 is a reactive element having a reactive surface. By way of example, discharge element 276 may include a high-melting-point metal (e.g., tungsten, platinum, etc.). In one embodiment, a thermal transfer system cools discharge element 276 to prevent overheating (e.g., discharge element may be thermally coupled to a water-cooled heat sink, etc.).

During a heating operation, cover 274 may be disposed over discharge element 276. In one embodiment, discharge assembly 272 includes an actuator that moves cover 274 to selectively expose discharge element 276. Cover 274 may translate, rotate, or otherwise move relative to discharge element 276. The actuator may be engaged by processing circuit 240 to selectively expose discharge element 276. The actuator may include a linear actuator, a rotational actuator, or still another type of actuator. In some embodiments, the actuator is an electrical device. In other embodiments, the actuator is a hydraulic, pneumatic, pyrotechnic, or other type of device configured to interface with related systems of metastable gas heating assembly 200.

Metastable gas within the inner volume of hood 270 is deactivated upon interfacing with discharge element 276, thereby reducing the amount of metastable gas within the inner volume of hood 270. In some embodiments, the reactive surface of discharge element 276 has an area that is greater than the surface area of the reactive elements of target component 260, thereby increasing the likelihood that metastable gas will interface with discharge element 276 rather than the reactive elements of target component 260. In other embodiments, an actuator protrudes discharge element 276 into the inner volume of hood 270 (e.g., partially inserted, inserted to separate the inner volume into a first chamber containing target component 260 and a second chamber in fluid communication with gas supply 230, etc.) thereby reducing the transfer of energy to the reactive elements of target component 260.

Referring still to the embodiment shown in FIG. 14, metastable gas heating assembly 200 includes a secondary gas supply 236. Secondary gas supply 236 provides a second gas that at least one of displaces, dilutes, dissipates, purges, disperses, and evacuates the metastable gas mixture. Dissipating the metastable gas mixture reduces the transfer of energy into reactive elements of target component 260 (e.g., to reduce the risk of overheating target component 260, to facilitate the removal of target component 260 after a heating operation is complete, etc.). As shown in FIG. 14, secondary gas supply 236 is selectively coupled to hood 270 with a valve 238. In some embodiments, a processing circuit selectively actuates valve 238 upon receiving an event signal (e.g., from a timer module, from a sensor module in communication with a sensor, etc.). According to other embodiments, secondary gas supply 236 otherwise provides the second gas to at least one of displaces, dilutes, dissipates, purges, disperses, and evacuates the metastable gas. By way of example, the second gas may de-excite the metastable gas (e.g., oxygen), dilute the metastable gas mixture, or have a specified flow pattern to force out or entrain the metastable gas mixture.

According to still another embodiment, a species (e.g., a gas, a vapor, etc.) is disposed within the metastable gas. In one embodiment, the species is configured to reduce the interaction between the metastable gas and reactive elements of target component 260 by forming an intermediate shielding coating (i.e. boundary layer, covering layer, etc.) on the reactive surfaces of the reactive elements. In one embodiment, the species reacts with the reactive surface of the reactive element at a specified temperature to produce the shielding coating. A species that reacts with the reactive surface at a specified temperature reduces the transfer of energy into the reactive elements of target component 260 (e.g., to reduce the risk of overheating target component 260, to facilitate the removal of target component 260 after a heating operation is complete, etc.). In one embodiment, the shielding coating is a nonreactive coating that does not deactivate the metastable gas.

Figure 15:
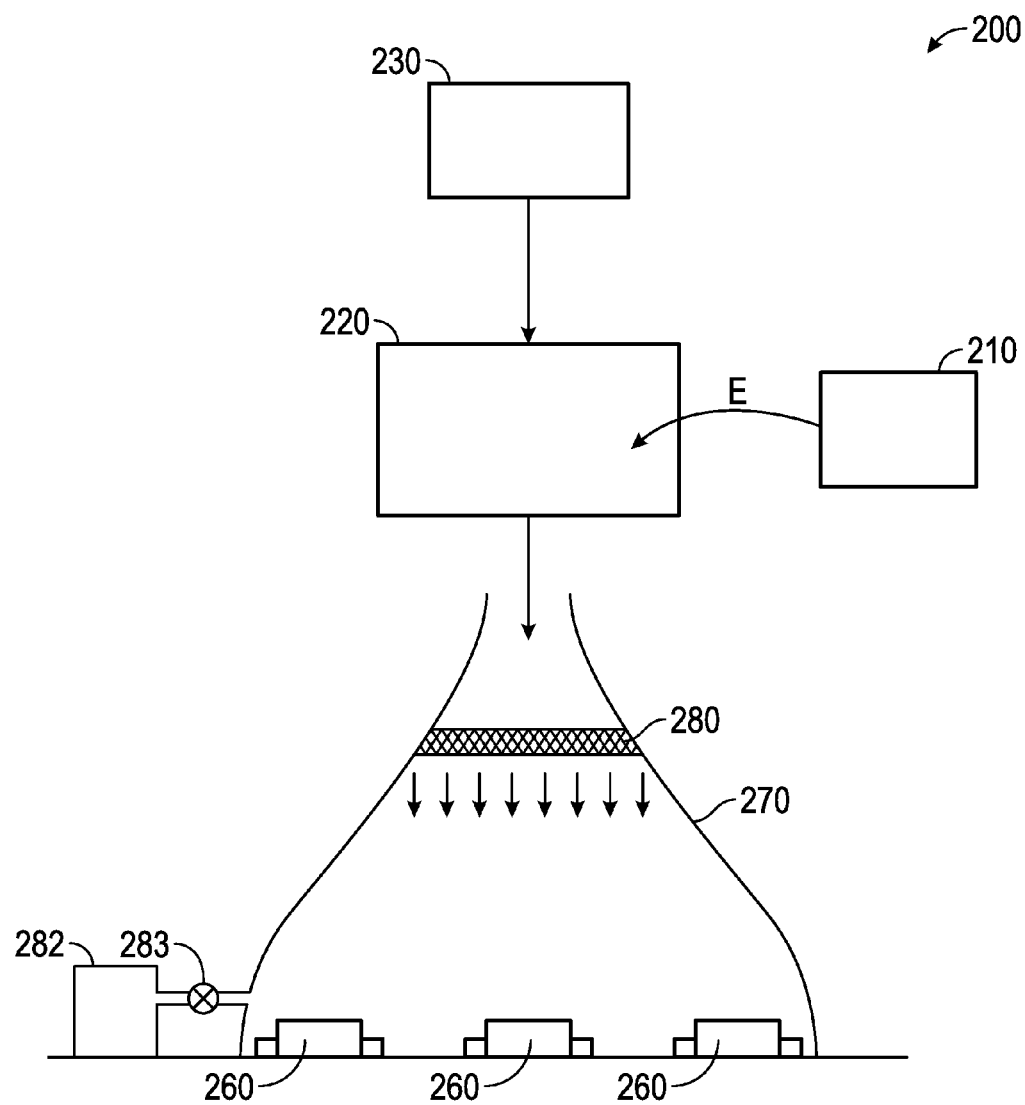
FIGS. 15-16 are side plan views of metastable gas heating assemblies including a flow device and a fluid control device positioned within a housing, according to various embodiments.
Figure 16:
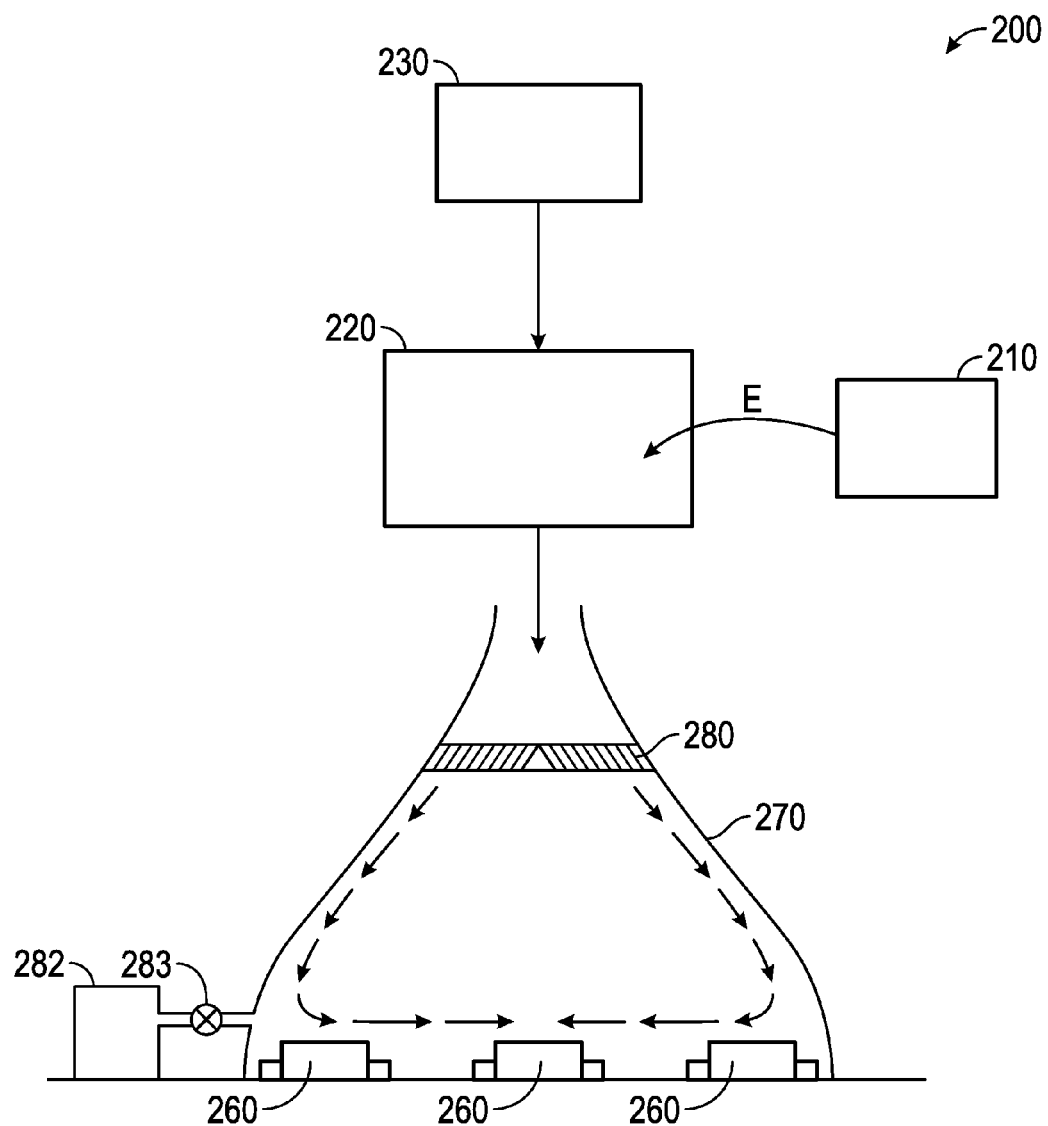

Referring next to the exemplary embodiment shown in FIGS. 15-16, metastable gas heating assembly 200 includes a flow device, shown as flow device 280. In one embodiment, flow device 280 varies the thermal-spatial delivery profile of the metastable gas mixture (e.g., the profile across which the metastable gas mixture is capable of transferring energy). In another embodiment, flow device 280 guides the metastable gas mixture as it flows toward target component 260. As shown in FIGS. 15-16, flow device 280 is positioned in hood 270 and offset from target components 260. In other embodiments, flow device 280 is integrally formed with the walls of hood 270. By way of example, flow device 280 may protrude into the inner volume of hood 270, may include features (e.g., fins, depressions, etc.) formed into an inner surface of hood 270, or may include still another arrangement of components. In still other embodiments, flow device 280 is disposed within a conduit coupling gas supply 230 to container 220, within container 220, within a conduit between container 220 and hood 270, or still otherwise positioned. Flow device 280 positioned within a conduit upstream of hood 270 may vary the flow characteristics (e.g., Reynolds number, etc.) of the metastable gas mixture.

Referring again to FIGS. 15-16, the metastable gas engages flow device 280 as it flows through the inner volume of hood 270. By way of example, the metastable gas may change direction upon contact with surfaces of flow device 280. According to another embodiment, the flow of metastable gas is otherwise affected upon interaction (e.g., physical interaction, magnetic interaction, etc.) with flow device 280. In one embodiment, flow device 280 includes at least one of voids in a non-woven material, paths through a woven material, apertures in a disc of material, or still another feature. Flow device 280 is manufactured from a nonreactive material and thereby does not deactivate the metastable gas, according to one embodiment.

As shown in FIG. 15, flow device 280 includes a diffuser. The diffuser is configured to uniformly distribute (e.g., entirely unify, partially unify, etc.) the metastable gas mixture flow within hood 270. Uniformly distributing the flow of gas within hood 270 may reduce the risk of inadvertently heating reactive elements of target components non-uniformly. By way of example, uniform distribution reduces the risk of melting a first volume of coupling material positioned within the center of hood 270 before a second volume of coupling material positioned at the periphery of hood 270.

As shown in FIG. 16, flow device 280 includes a guide. The guide is configured to distribute the metastable gas mixture flow toward a target area of hood 270. By way of example, flow device 280 may direct the flow of gas toward a target area of a selectively enclosed portion of target component 260. In the embodiment shown in FIG. 16, the guide directs the flow of gas toward the periphery of hood 270. In another embodiment, the guide may direct the flow of gas toward a particular target component 260. The guide may include an actuator configured to at least one of move and switch a movable surface of the guide from a first position to a second position (e.g., to move the metastable gas mixture alternately from left to right and right to left, thereby providing more uniform heating.

Referring still to FIGS. 15-16, metastable gas heating assembly 200 includes a fluid control device 282 configured to vary the velocity of a gas (e.g., the metastable gas mixture, etc.). In one embodiment, fluid control device 282 includes an aerodynamic surface (e.g., a fan blade) configured to increase the velocity of the metastable gas mixture. According to another embodiment, fluid control device 282 includes a vacuum assembly configured to generate a low-pressure environment within hood 270 (e.g., a pressure differential relative to container 220, a pressure differential across two portions of hood 270, a pressure differential relative to gas supply 230, etc.). Such a low-pressure environment may facilitate the flow of gas (e.g., the metastable gas mixture, etc.) through metastable gas heating assembly 200. In one embodiment, the vacuum assembly operates according to a cyclic procedure whereby a supply valve (e.g., a valve between container 220 and hood 270) is closed, and the vacuum assembly pumps down the pressure within hood 270 to a lower pressure (e.g., to below atmospheric pressure, to zero pressure, etc.) after opening a valve, shown as exhaust valve 283. The supply valve may thereafter be opened, the vacuum drawing the metastable gas mixture into hood 270. In other embodiments, the vacuum assembly operates as part of a continuous process with both exhaust valve 283 and the supply valve open. Target components 260 may be stationary or moving relative to hood 270. As shown in FIGS. 15-16, fluid control device 282 is positioned within an inlet of hood 270. In other embodiments, fluid control device 282 is positioned in another location (e.g., at a base of hood 270 adjacent target component 260, etc.).

Figure 17:
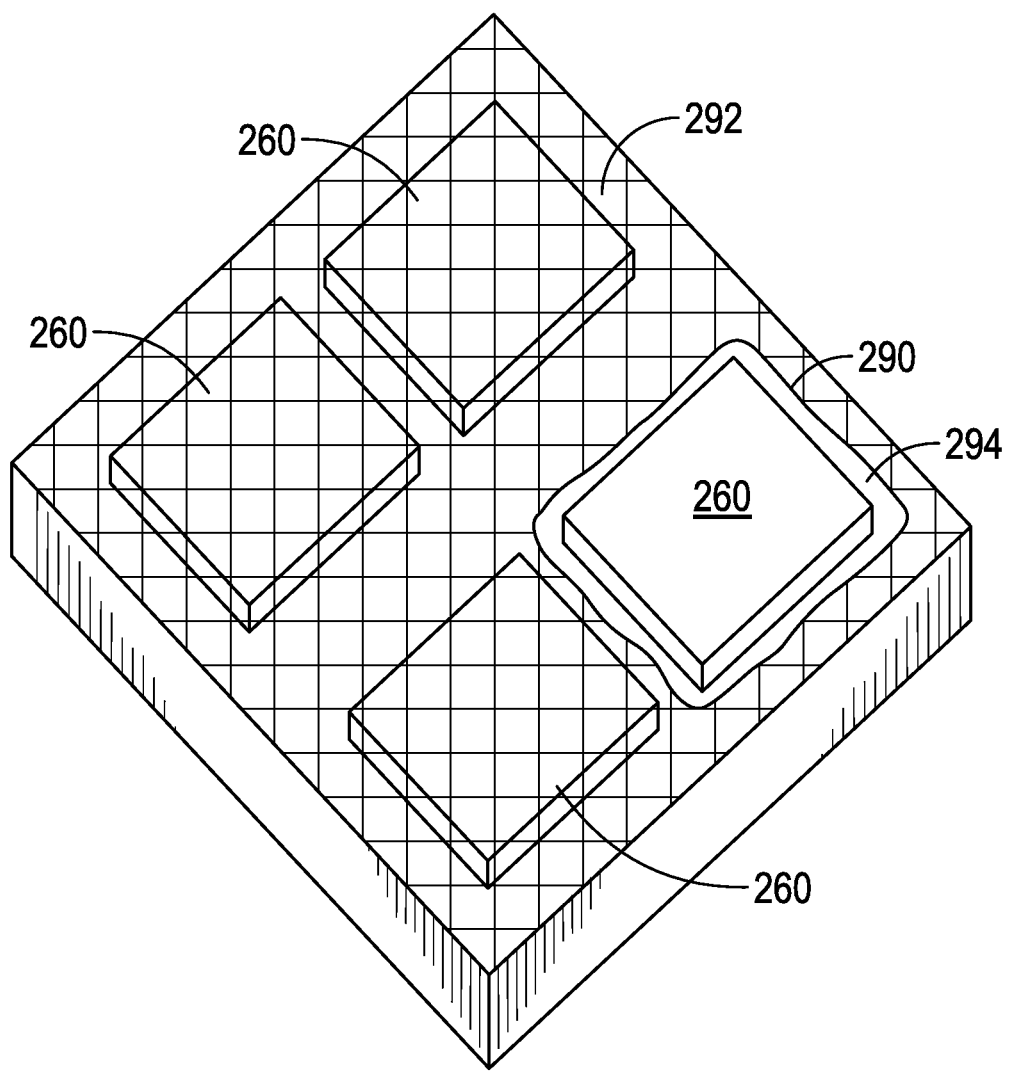
FIG. 17 is an elevation view of a nonreactive material disposed along a portion of a target component, according to one embodiment.

Referring next to the embodiment shown in FIG. 17, a nonreactive material (e.g., a nonmetallic material), shown as cover 290, is provided to shield various portions or elements from the metastable gas mixture. As shown in FIG. 17, cover 290 defines a covered portion 292 and an exposed portion 294. In one embodiment, cover 290 is configured to reduce the interaction between the metastable gas mixture and a portion or element protected by covered portion 292. In the embodiment shown in FIG. 17, cover 290 is disposed over various target components 260 (e.g., electronic components), and at least one target component 260 is exposed. Such a cover 290 may be used to protect certain target components 260 from heating while selectively heating other target components. In other embodiments, cover 290 is configured to protect a portion of a target component 260 while leaving a portion thereof exposed. By way of example, cover 290 may define covered portion 292 across a metallic cover of an electronic component while defining exposed portion 294 to leave the contacts thereof open, thereby facilitating selective heating. Accordingly, cover 290 may facilitate the selective heating of target component 260 (e.g., to protect heat-sensitive portions of target component 260 from inadvertent exposure to the metastable gas mixture).

According to one embodiment, cover 290 is a sheet disposed over a portion of target component 260. As shown in FIG. 17, cover 290 is a sheet disposed over a plurality of target components 260, thereby protecting the metallic components thereof (e.g., contacts, leads, covers, etc.) from the metastable gas mixture. The sheet may include a single material or a plurality of materials mixed, spatially distributed, or otherwise arranged. The sheet may include a single layer of material or plurality of layers disposed along one another. By way of example, the sheet may include a ceramic material, a polymeric material (e.g., polytetrafluoroethylene, etc.), or still another material. In other embodiments, the sheet includes an adhesive layer applied to a surface of a base layer. According to another embodiment, cover 290 is formed by another process (e.g., vapor deposition; the application of a liquid, gelled, or powdered material to target component 260; etc.). By way of example, cover 290 may be a gel material applied over a portion of target component 260.

In one embodiment, target component 260 includes a heat-sensitive metal (e.g., stainless steel, etc.) having properties (e.g., ductility, hardness, strength, etc.) that are affected by exposure to heat. Such metals may be joined (e.g., brazed) to other components with metastable gas heating assembly 200. Cover 290 may be disposed over a portion of the heat-sensitive metal to form covered portion 292 and exposed portion 294. Metastable gas interfacing with cover 290 is not deactivated, according on one embodiment, thereby reducing the risk of directly heating covered portion 292 of target component 260. Metastable gas may interface with a reactive surface (e.g., a metallic surface) of exposed portion 294 thereby directly heating a portion of target component 260. In another embodiment, the cover 290 envelops the heat-sensitive metal. Rather than heating the heat sensitive metal, metastable gas may interface with a coupling material to join (e.g., braze) the metal components. Cover 290 reduces inadvertent heating of the heat-sensitive metal while leaving the coupling material exposed.

In another embodiment, target component 260 includes a circuit assembly having a circuit board and a plurality of electronic components (e.g., a multichip module). Cover 290 may be disposed over a subset of the electronic components, a lead or contact of an electronic component, a body portion of an electronic component, a portion of the circuit board (e.g., portions having embedded circuits thereon), or still other areas of target component 260. In one embodiment, cover 290 facilitates the selective installation or extraction of a subset of electronic components. By way of example, cover 290 may be disposed over a plurality of electronic components, along with their respective leads or contacts and the corresponding engagement portions of the circuit assembly, to form covered portion 292. An electronic component within exposed portion 294 may be extracted using metastable gas heating assembly 200 as target component 260 is exposed to metastable gas mixture. The metastable gas may interface with reactive surfaces within exposed portion 294 (e.g., surfaces of a lead, surfaces of a contact, the surface of a coupling material, etc.) to soften a coupling material. Such softening may allow for the extraction of the electronic component (e.g., with a retrieval device, etc.).

Figure 18:
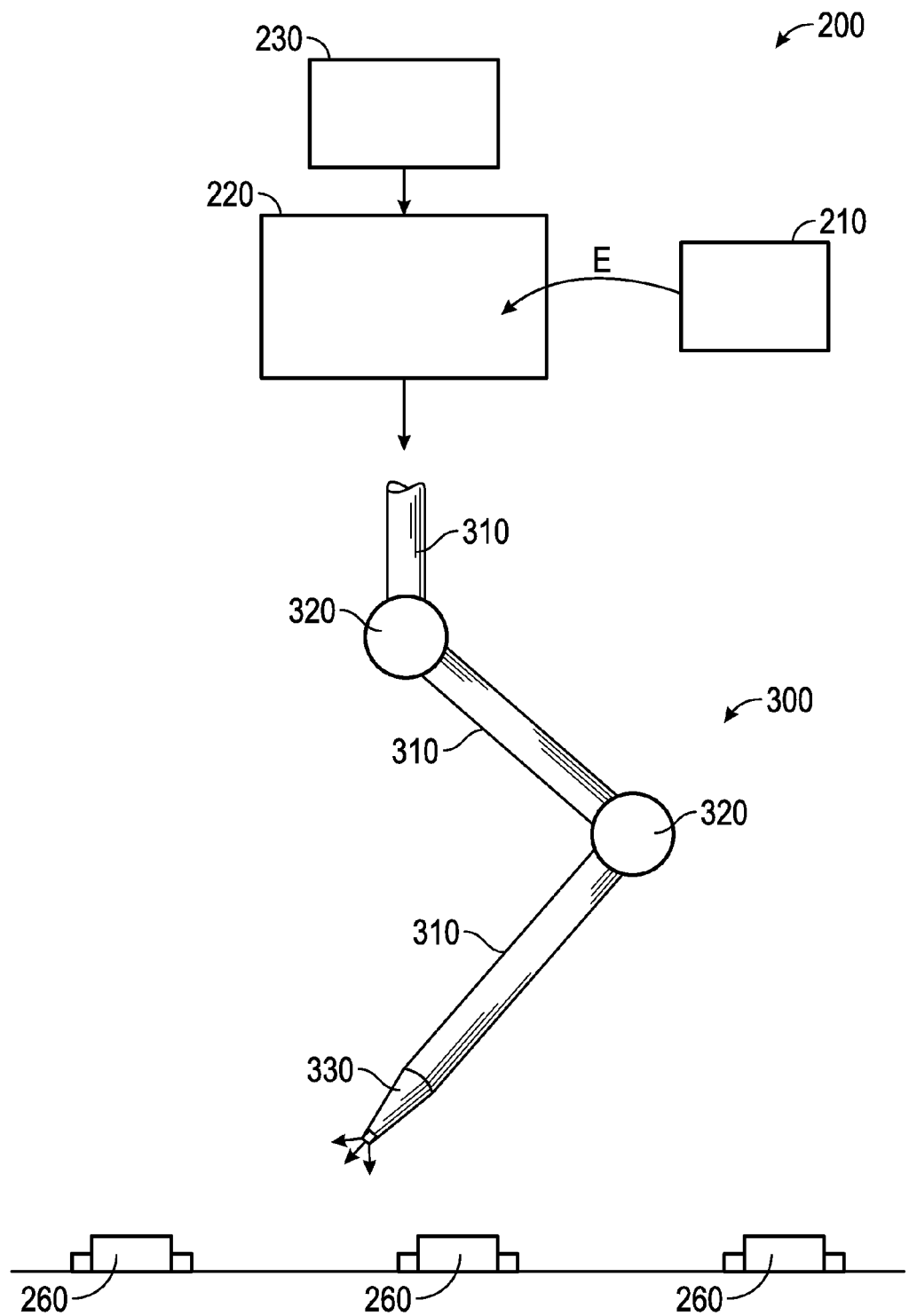
FIG. 18 is a side plan view of a metastable gas heating assembly including an arm, according to one embodiment.

Referring next to the embodiment shown in FIG. 18, the metastable gas mixture may flow from generator 210, through an arm, shown as arm 300, to a moveable tip (e.g., nozzle, end, etc.), shown as tip 330. The metastable gas mixture flows through tip 330 and may be directed toward a target component 260 at a desired distance, a desired angle, or at still another orientation. According to one embodiment, arm 300 includes a plurality of rigid tubular members 310 connected together with a plurality of rotatable couplings, shown as rotatable couplings 320. In other embodiments, the metastable gas mixture may flow to the tip 330 via a flexible tube or bellows, or via any combination of rigid tubes, flexible tubes, bellows, sliding couplings, rotatable couplings, and flexible couplings, or still another device configured to provide a gas-containing path from generator 210 to a moveable tip, shown as tip 330.

In some embodiments, tip 330 is translatable and rotatable, with a full 6 degrees of freedom of motion throughout a work envelope. In other embodiments, tip 330 may be constrained (i.e., may have 5 or fewer degrees of freedom of motion over at least a portion of a work envelope). By way of example, tip 330 may be mounted in a fixed orientation and be moveable only by translation in X, Y, and Z. By way of another example, tip 330 may be constrained in position and orientation by the limits of motion of arm 300 (e.g., constrained by the limits of motion of rotatable couplings 320, etc.).

In some embodiments, target component 260 is moveable instead of, or in addition to, tip 330. By way of example, target component 260 may be attached to a translation stage. In one embodiment, the translation stage (e.g., a table, a flat plate, etc.) facilitates X and Y movement of target component 260, while tip 330 is rotatable and is translatable in Z only.

Referring still to FIG. 18, arm 300 directs the metastable gas mixture toward target component 260 to perform a heating operation (e.g., soldering, brazing, etc.), according to one embodiment. Directing metastable gas mixture with arm 300 and tip 330 may facilitate the selective heating of target component 260 (e.g., by protecting heat-sensitive portions of target component 260 from inadvertent exposure to the metastable gas mixture). In other embodiments, generator 210 may be mounted proximate to tip 330, with base gas flowing from gas supply 230 to generator 210 via arm 300 or another moveable gas-containing path. In other embodiments, tip 330 includes a wall that defines an inner volume. Generator 210 may be configured to excite the base gas from gas supply 230 and produce the metastable gas mixture within the inner volume of tip 330.

At least one of tip 330 and target component 260 may be moved manually by an operator. In other embodiments, at least one of tip 330 and target component 260 may be moved at least in part by one or more actuators. The actuators may be linear actuators, rotational actuators, or other types of actuators, and may be electric, pneumatic, hydraulic, or still another type of actuator. One or more of the actuators may be coupled directly to tip 330. In other embodiments, one or more of the actuators is integrated into arm 300 (e.g., one or more of rotatable couplings 320 may include a rotary actuator, etc.). The actuators may include an industrial robot, a robot arm, or still another type of motion-control system.

In one embodiment, rotatable couplings 320 are configured to move tip 330 relative to a reactive surface of target component 260. As shown in FIG. 18, tip 330 is shaped to direct the flow of the metastable gas mixture toward a reactive element of target component 260 (e.g., toward a portion of a metal plate, toward a particular target component 260, toward a coupling material positioned along a portion of target component 260, etc.). In one embodiment, tip 330 includes a nozzle shaped to increase the velocity of the metastable gas mixture. The nozzle may focus the flow of the metastable gas mixture, thereby protecting heat sensitive portions of target component 260 from inadvertent heating. In another embodiment, tip 330 includes a diffuser shaped to decrease the velocity of the metastable gas mixture.

According to one embodiment, arm 300 directs metastable gas mixture toward target component 260 in an open environment. According to another embodiment, arm 300 is positioned at least partially within a housing shaped to contain the metastable gas mixture. According to still another embodiment, a vacuum draw system recovers at least one of activated metastable gas mixture, the deactivated metastable gas, or other constituents provided by arm 300.

In some embodiments, rotatable couplings 320 are computer numerically controlled. By way of example, a path (e.g., a path around the periphery of an electronic component) may be preprogrammed into a memory of a processing circuit. The preprogrammed path may be read by a controller and translated into control signals for rotatable couplings 320. In one embodiment, rotatable couplings 320 move tip 330 along the preprogrammed path as part of a heating operation. In one embodiment, a sensor (e.g., a proximity sensor, a laser rangefinder, etc.) may convey a distance signal to the controller. By way of example, the controller may move arm 300 away from or toward target component 260 as the distance signal falls below or exceeds a threshold range. In another embodiment, a temperature sensor may convey a temperature of the target component to the controller. By way of example, arm 300 may convey the metastable gas mixture toward a particular portion of target component 260 until the temperature of the particular portion exceeds a threshold value. In other embodiments, the controller at least one of disengages generator 210, reduces the flow of base gas (e.g., with a solenoid actuated valve), and reduces the flow of the metastable gas mixture (e.g., with a solenoid actuated valve) as the temperature of target component 260 exceeds a threshold value (e.g., the melting point of a lead or contact, the temperature at which a processor of electronic component may be damaged, etc.). According to still other embodiments, the controller triggers still another action upon receiving an event signal.

It is important to note that the construction and arrangement of the elements of the systems and methods as shown in the embodiments are illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements. It should be noted that the elements and/or assemblies of the enclosure may be constructed from any of a wide variety of materials that provide sufficient strength or durability, in any of a wide variety of colors, textures, and combinations. The order or sequence of any process or method steps may be varied or re-sequenced, according to alternative embodiments. Other substitutions, modifications, changes, and omissions may be made in the design, operating conditions, and arrangement of the preferred and other embodiments without departing from scope of the present disclosure or from the spirit of the appended claims.

The present disclosure contemplates methods, systems, and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data, which cause a general-purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps, and decision steps.

What is claimed is:

1. A heating apparatus, comprising:
   a gas supply for providing a base gas;
   a generator configured to excite the base gas to produce a metastable gas mixture that includes a metastable gas; and
   a housing including a wall shaped to contain the metastable gas mixture and selectively enclose a reactive element of a target component,
   wherein interaction between the metastable gas and at least one of a coupling material and the reactive element transfers energy to selectively heat the at least one of the coupling material and the target component, wherein the reactive element is at least partially metallic.

2. The apparatus of claim 1, wherein the housing comprises a nozzle.

3. The apparatus of claim 1, further comprising an actuator configured to move the target component relative to the housing.

4. The apparatus of claim 1, wherein the target component includes a substrate and an electronic component.

5. The apparatus of claim 4, wherein the substrate includes a contact and the electronic component includes a lead.

6. The apparatus of claim 5, wherein the reactive element includes a coupling material positioned along at least one of the contact and the lead.

7. The apparatus of claim 6, further comprising a removal device configured to interface with the electronic component and apply a tensile force to the coupling material such that the electronic component is separated from the substrate as the coupling material reaches a threshold temperature.

8. An apparatus for heating reactive elements, comprising:
a gas supply for providing a base gas;
a generator configured to excite the base gas from the gas supply to produce a metastable gas mixture that includes a metastable gas;
a housing shaped to contain the metastable gas and a target component;
a flow device positioned within the housing, the flow device configured to vary a thermal-spatial delivery profile of the metastable gas mixture; and
a nonreactive material disposed along the target component to define a covered portion and an exposed portion,
wherein interaction between the metastable gas mixture and the exposed portion transfers energy to selectively heat the target component.

9. The apparatus of claim 8, further comprising a processing circuit configured to disengage the generator upon receiving an event signal.

10. The apparatus of claim 9, further comprising a timer module configured to produce the event signal after a predetermined period of time.

11. The apparatus of claim 9, further comprising a sensor configured to provide sensor signals to the processing circuit.

12. The apparatus of claim 11, further comprising a sensor module configured to produce the event signal as the sensor signals exceed a threshold value.

13. The apparatus of claim 12, wherein the sensor is a temperature sensor.

14. The apparatus of claim 13, wherein the threshold value is related to a temperature of the exposed portion.

15. The apparatus of claim 8, further comprising a processing circuit configured to disengage the gas supply upon receiving an event signal.

16. The apparatus of claim 8, further comprising a secondary gas supply selectively coupled to the housing with a valve.

17. The apparatus of claim 16, further comprising a processing circuit configured to open the valve upon receiving an event signal thereby at least one of diluting and dispersing the metastable gas mixture.

18. The apparatus of claim 8, wherein the flow device is a diffuser.

19. The apparatus of claim 18, wherein the diffuser is shaped to uniformly distribute the metastable gas mixture across the target component.

20. An apparatus for heating reactive elements, comprising:
a gas supply for providing a base gas;
a generator configured to excite the base gas from the gas supply to produce a metastable gas mixture that includes a metastable gas;
a conduit having a movable exit port, wherein the movable exit port is shaped to direct the metastable gas mixture toward a reactive element of a target component, interaction between the metastable gas mixture and the reactive element transferring energy to selectively heat the target component; and
an actuator coupled to the conduit and configured to move the movable exit port relative to the target component.

21. The apparatus of claim 20, wherein the conduit comprises a movable arm having a plurality of joints.

22. The apparatus of claim 20, wherein the conduit comprises a flexible hose.

23. The apparatus of claim 20, further comprising a cooling element configured to decrease the temperature of the target component.

24. The apparatus of claim 23, wherein the cooling element is positioned along the target component.

25. The apparatus of claim 23, wherein the cooling element comprises a nonreactive material configured to isolate the cooling element from the metastable gas.

26. The apparatus of claim 23, further comprising a nonreactive coating disposed over at least a portion of the cooling element.

27. The apparatus of claim 20, further comprising a nonreactive material disposed along at least a portion of the target component, the nonreactive material configured to reduce interaction between the metastable gas and a covered portion of the target component.

28. The apparatus of claim 27, wherein the nonreactive material includes a ceramic material.

29. The apparatus of claim 27, wherein the nonreactive material includes a polymeric material.

30. The apparatus of claim 20, further comprising a sensor configured to provide a sensing signal that relates to a concentration of the metastable gas.

31. The apparatus of claim 30, wherein the sensor comprises a thermocouple having an end disposed within a flow of the metastable gas mixture.

32. The apparatus of claim 30, further comprising a controller configured to adjust the generator based on the sensing signal.

* * * * *